United States Patent [19]
Kaneko et al.

[11] Patent Number: 5,494,991
[45] Date of Patent: Feb. 27, 1996

[54] POLYIMIDES AND PROCESSES FOR PREPARING THE SAME

[75] Inventors: Ichiro Kaneko; Atushi Sugitani; Masahiro Yuyama; Kiyoshi Motomi, all of Ibaraki, Japan

[73] Assignee: Shin-Etsu Chemical Co., Ltd., Tokyo, Japan

[21] Appl. No.: 262,318

[22] Filed: Jun. 17, 1994

[30] Foreign Application Priority Data

Jun. 18, 1993 [JP] Japan .................................. 5-172691
Nov. 10, 1993 [JP] Japan .................................. 5-304863

[51] Int. Cl.⁶ ........................... C08G 73/10; C08G 69/26
[52] U.S. Cl. .......................... 528/179; 528/125; 528/128; 528/170; 528/172; 528/173; 528/183; 528/184; 528/188; 528/220; 528/229; 528/310; 528/322; 528/353
[58] Field of Search .................................. 528/310, 322, 528/353, 220, 183, 188, 125, 128, 170, 179, 172, 173, 229, 184

[56] References Cited

U.S. PATENT DOCUMENTS 4,978,734  12/1990  Khanna .................................. 528/184
4,980,447  12/1990  Khanna .................................. 528/184
5,173,561  12/1992  Gupta .................................... 528/179

OTHER PUBLICATIONS

Journal of Polymer Science Part A: Polymer Chemistry, 31(4) 1029–1033 Mar. 30, (1993), Sakaguchi et al.

Primary Examiner—P. Hampton-Hightower
Attorney, Agent, or Firm—Birch, Stewart, Kolasch & Birch

[57] ABSTRACT

Polyimides comprising recurring units of the following general formula (1)

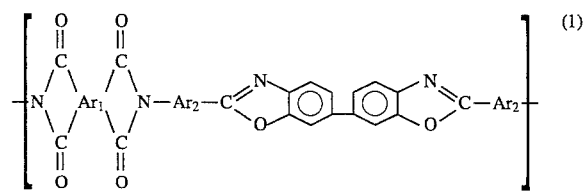

wherein $Ar_1$ represents a tetravalent aromatic group and each $Ar_2$ represents a divalent aromatic group. Polyimide copolymers and preparations of the polyimides and the polyimide copolymers are also described.

20 Claims, 1 Drawing Sheet

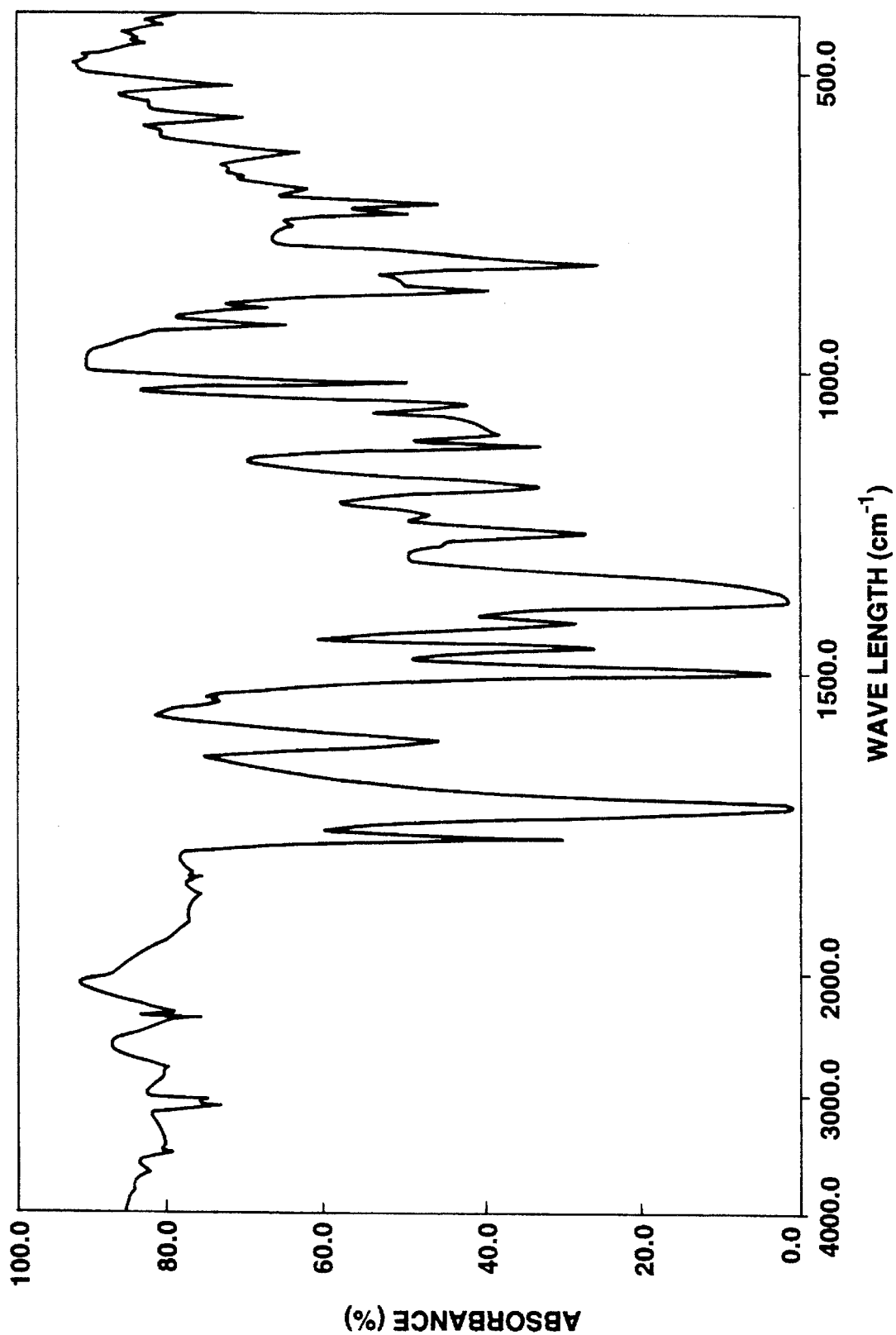

POLYIMIDES AND PROCESSES FOR PREPARING THE SAME

BACKGROUND OF THE INVENTION

1. Field of the Invention

This invention relates to novel polyimides which exhibit good dimensional stability, low water absorption and high mechanical properties and are adapted for use as substrates such as finely patternized flexible printed board substrates. The invention also relates to processes for preparing such polyimides as mentioned above.

2. Description of the Prior Art

It is known in the art that polyimide resins have very good resistances to heat and chemicals and very good electric and mechanical properties as well as other good characteristics.

A typical polyimide is one, for example, set forth in Japanese Patent Publication No. 36-10999, which is obtained from 4,4'-diaminodiphenyl ether and pyromellitic dianhydride. This polyimide has flexing ether bonds in the main chain thereof and is thus flexible irrespective of the fact that it consists of a totally aromatic polyimide. However, the polyimide has a low modulus of elasticity, an undesirably high coefficient of linear expansion and is poor in dimensional stability.

In recent years, there is a demand for the development of polyimide resins which have good dimensional stability along with good mechanical strength in fields such as finely patternized flexible printed boards. Currently employed polyimide resins exhibit a coefficient of linear expansion as undesirably high as about $3 \times 10^{-5}/°C.$, with the attendant problem that when laminated with metal sheets, are apt to warp or curl.

Moreover, there is an increasing demand for polyimide resins which have better thermal dimensional stability and good mechanical strength. Accordingly, extensive studies have been made on the improvement in properties of polyimide resins. To this end, many attempts have been made to use two or more aromatic diamines to improve the mechanical strength and thermal dimensional stability. However, in any of these attempts, it has not been possible to satisfy both requirements for thermal dimensional stability and good mechanical characteristics of polyimide resins.

SUMMARY OF THE INVENTION

It is accordingly an object of the present invention to provide a polyimide resin which is excellent not only in various properties such as heat resistance, but also in mechanical strength and thermal dimensional stability. A further object of the present invention is to provide an industrially advantageous process for preparing such a polyimide resin.

In order to attain the above objects, we made intensive studies and, as a result, found that the reaction between an aromatic tetracarboxylic acid dianhydride of the following general formula (4) and an aromatic diamine of the following general formula (5) results in a polyamido acid having main recurring units of the general formula (6), and that when the polyamido acid is thermally or chemically subjected to dehydration and ring-closure, a polyimide having main recurring units of the following general formula (1) is readily obtained. The thus obtained polyimide has good mechanical strength, a high modulus of elasticity, a low coefficient of linear expansion and low water absorption.

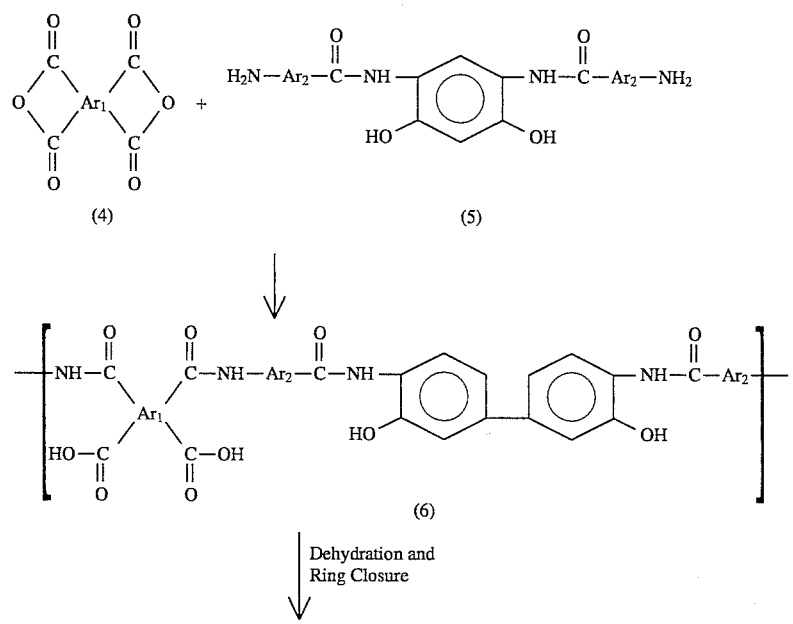

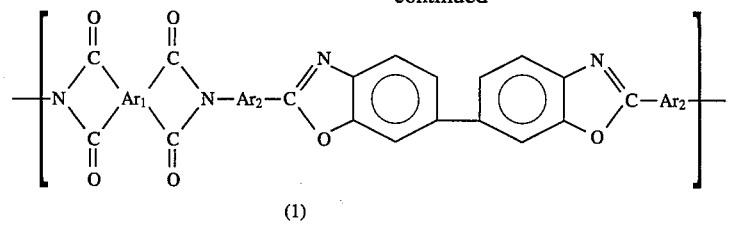

(1)

wherein $Ar_1$ represents a tetravalent aromatic group and $Ar_2$ represents a divalent aromatic group.

It is noted that there are known polyimidobenzobisthiazole and polyimidobenzobisoxazole as polyimides having aromatic heterocyclic rings and having a high modulus of elasticity (Maruyama et al., Polymer Preprints, Japan 39, No. 3782 (1990), Nozawa, New Materials No. 357 (1992), Y. Sakaguchi et al., Journal of Polymer Science Part A: Polymer Chemistry, 31(4) 1029–1033 (Mar. 30, 1993). However, according to the processes set out in these references, intended polymers are obtained by initially preparing aromatic diamines having a benzothiazole ring or a benzoxazole ring and then reacting with acid dianhydrides. The preparation of such aromatic heterocyclic diamines has the problem of its long, complicated operation procedure. In contrast, according to the process of the invention, the step is short and the procedure is simple, thereby ensuring preparation of benzoxazole ring-containing polyimides.

It has also been found that when an aromatic diamine of the general formula (5) which comprises, as its main component, a combination of 4,4'-bis(4-aminobenzamido)-3,3'-dihydroxybiphenyl and 4,4'-diaminodiphenyl ether, and a tetracarboxylic acid dianhydride are polymerized and the resultant polyamido acid copolymer is subjected to dehydration and ring closure, there can be obtained a polyimide copolymer having both recurring units of the following general formula (2) and recurring units of the following general formula (3), preferably, at a molar ratio between the recurring units of the formulas (2) and (3) of 10:90 to 90:10.

More particularly, according to one embodiment of the invention, there is provided a polyimide which comprises main recurring units of the afore-indicated general formula (1).

According to another embodiment of the invention, there is also provided a process for preparing a polyimide of the general formula (1) which comprises polymerizing an aromatic tetracarboxylic acid dianhydride of the above-said formula (4) and an aromatic diamine of the above-said formula (5) to obtain a polyamido acid of the above-said formula (6), and subjecting the polyamido acid to ring closure through dehydration.

According to a further embodiment of the invention, there is also provided a polyimide copolymer which comprises both recurring units of the above-said general formula (2) and recurring units of the above-said general formula (3).

Such a copolymer can be prepared according to a still further embodiment of the invention by a process which comprises polymerizing an aromatic diamine comprised mainly of 4,4'-bis(4-aminobenzamido)-3,3'-dihydroxybiphenyl and 4,4'-diaminodiphenyl ether and a tetracarboxylic acid dianhydride to obtain a polyamido acid copolymer, and subjecting the polyamido acid copolymer to ring closure through dehydration.

BRIEF DESCRIPTION OF THE DRAWING

The drawing is an infrared absorption spectrum chart of a benzoxazole ring-containing polyimide film obtained in Example 1.

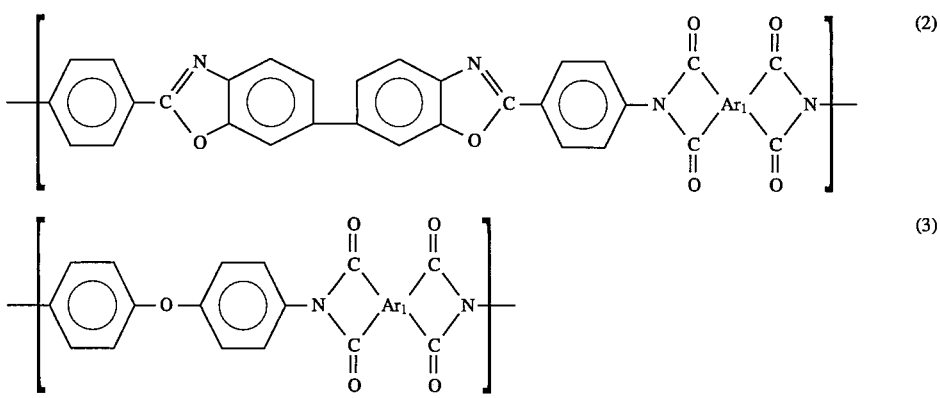

In the formulas, $Ar_1$ represents a tetravalent aromatic hydrocarbon group.

The copolymer not only has good properties such as a heat resistance, but also high mechanical strength, a low coefficient of thermal expansion, low water absorption, a high modulus of elasticity, good flexibility along with good thermal dimensional stability. The present invention has been accomplished based on the above findings.

DETAILED DESCRIPTION OF THE INVENTION

The polyimide of the invention is one which comprises recurring units represented by the following general formula (1)

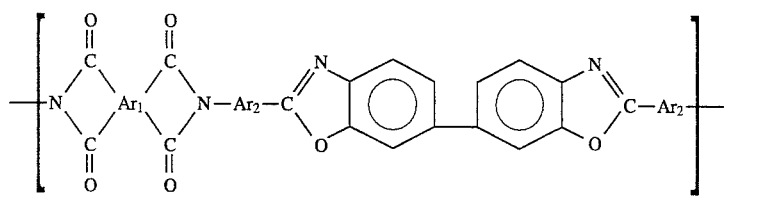

(1)

wherein $Ar_1$ represents a tetravalent aromatic group and each $Ar_2$ represents a divalent aromatic group.

This polyimide can be obtained by reacting an aromatic acid dianhydride of the following general formula (4) and an aromatic diamine of the following general formula (6) to obtain a polyamido acid having main recurring units of the following general formula (6) and subjecting the polyamido acid to ring closure through dehydration.

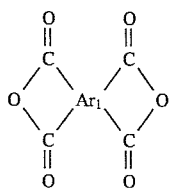

(4)

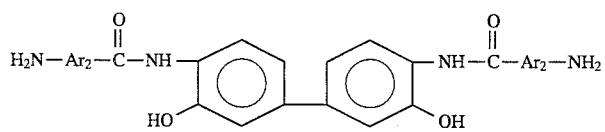

(5)

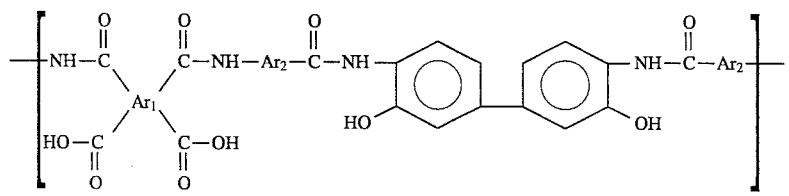

(6)

In the above formula (4), $Ar_1$ represents a tetravalent aromatic group. Examples of the aromatic tetracarboxylic acid dianhydride having the group represented by $Ar_1$ include pyromellitic acid dianhydride, 3,3',4,4'-biphenyltetracarboxylic acid dianhydride, 2,3,3',4'-biphenyltetracarboxylic acid dianhydride, 2,3,6,7-naphthalenetetracarboxylic acid dianhydride, 3,3'4,4'-benzophenonetetracarboxylic acid dianhydride, 1,4,5,8-naphthalenetetracarboxylic acid dianhydride, 2,2-bis(3,4-dicarboxyphenyl)propane dianhydride, bis(3,4-dicarboxyphenyl)ethane dianhydride, bis(3,4-dicarboxyphenyl)ether dianhydride, 1,1-bis(3,4-dicarboxyphenyl)ethane dianhydride, 3,4,9,10-perylenetetracarboxylic acid dianhydride, benzene-1,2,3,4-tetracarboxylic acid dianhydride, 2,3,6,7-anthracenetetracarboxylic acid dianhydride, 1,2,7,8-phenylenetetracarboxylic acid dianhydride and the like. These may be used singly or in combination. This means that $Ar_1$ in the recurring units of the formula (6) may represent combinations of two or more of the above-indicated compounds.

In the formula (5) for the aromatic diamines along with the formulas (1) and (6), $Ar_2$ represents a divalent aromatic group. Specific examples include those groups indicated below.

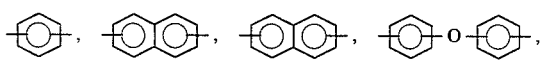

-continued

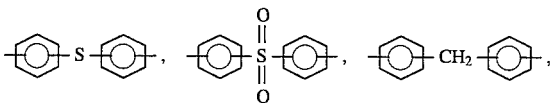

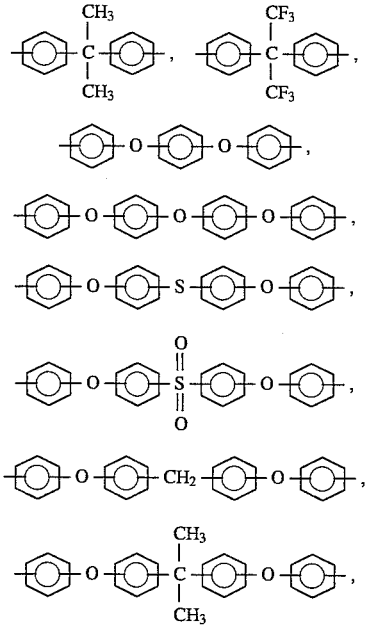

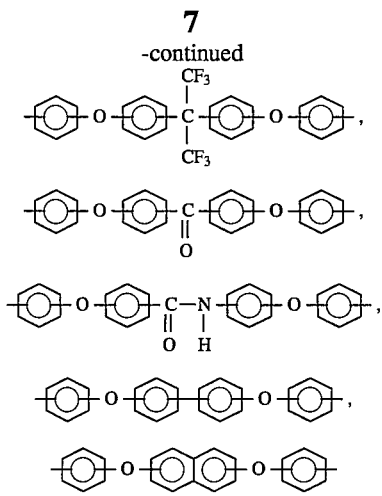

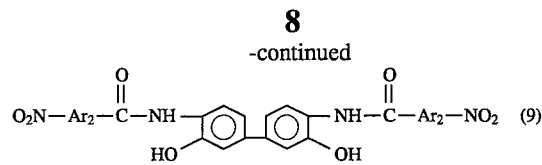

wherein X represents a halogen atom and $Ar_2$ has the same meaning as defined above.

The aromatic diamine represented by the general formula (5) can be prepared, for example, according to the following procedure. 3,3'-Dihydroxy-4,4'-diaminobiphenyl of the following formula (7), which has hydroxyl groups at the ortho positions of the respective amino joined to the benzene ring is reacted with a nitro aromatic carboxylic acid chloride of the following general formula (8) in the presence of a tertiary amine in an organic solvent to obtain a dinitro compound of the following general formula (9).

In the above reaction, two equivalents of the nitro aromatic carboxylic acid halide of the general formula (8) should be preferably used per mole of 3,3'-dihydroxy-4,4'-diaminobiphenyl of formula (7). The reaction solvents include benzene, toluene, xylene, tetrahydrofuran, 1,4-dioxane, dimethyl ether, 1,2-dichloroethane, chlorobenzene, dichloromethane and the like. These may be used singly or in combination. The tertiary amines include, for example, pyridine, triethylamine, tributylamine and the like, which may be used singly or in combination. The tertiary amine should preferably be used in an amount of equivalent by one or two times more than the nitro aromatic carboxylic acid halide of the general formula (8). The reaction time and temperature are not critical and are generally, in ranges not higher than 30° C. and not longer than 4 hours, respectively.

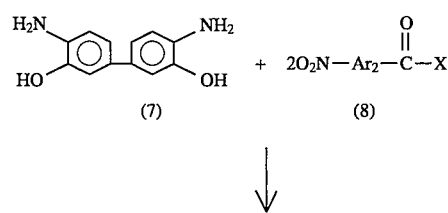

Subsequently, the thus obtained dinitro compound of the general formula (9) is reduced according to a procedure, such as catalytic reduction, using a metal catalyst, thereby obtaining an aromatic diamine of the afore-indicated general formula (5).

Examples of the aromatic diamines include those of the following formulas. These may be used singly or in combination.

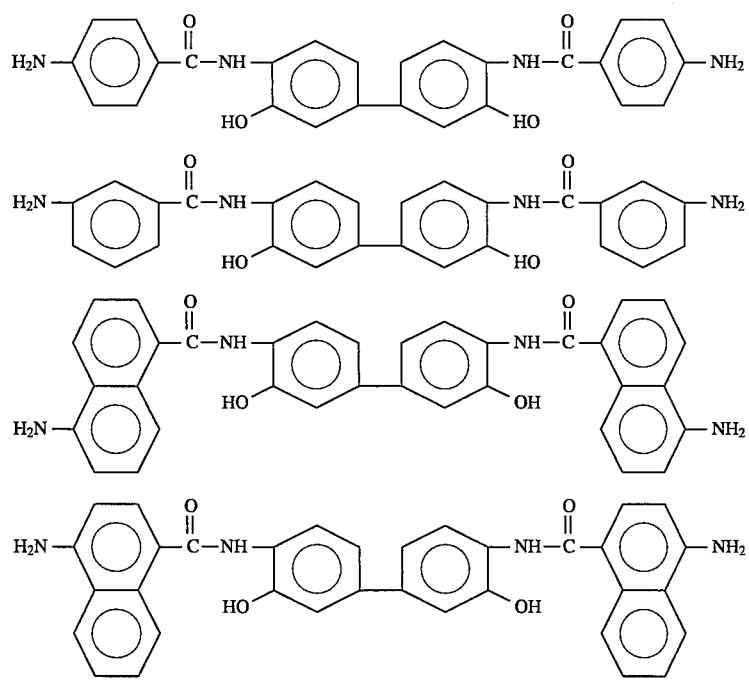

-continued

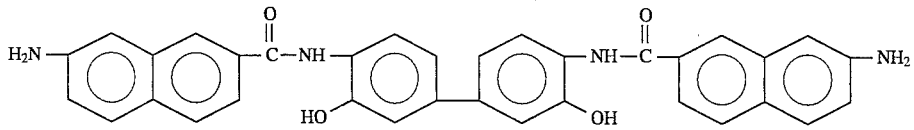

As described above, the polyamido acid can be obtained by reaction between the aromatic tetracarboxylic acid dianhydride of the general formula (4) and the aromatic diamine of the general formula (5). If necessary, other types of polyvalent amines may be used in amounts within a range where the purpose and effect of the invention can be appropriately achieved. Preferably, these other polyvalent amines may be used in amounts not larger than 10 mole %, more preferably not larger than 5 mol %, based on the total of the diamines.

Specific examples of the polyvalent amines include, 4,4'-bis(4-aminophenoxy)biphenyl, 4,4'-diaminodiphenylsulfone, 3,3'-diaminodiphenylsulfone, bis[4-(4-aminophenoxy)phenyl]sulfone, bis[4-(3-aminophenoxy)phenyl]sulfone, 1,4-bis(4-aminophenoxy)benzene, 1,3-bis(4-aminophenoxy)benzene, 1,3-bis(3-aminophenoxy)benzene, 1,4-bis(4-aminophenyl)benzene, bis[4-(4-aminophenoxy)phenyl] ether, 4,4'-diaminodiphenylmethane, bis(3-ethyl-4-aminophenyl)methane, bis(3-methyl-4-aminophenyl)methane, bis(3-chloro-4-aminophenyl)methane, 3,3'-dimethoxy-4,4'-diaminodiphenyl, 3,3'-dimethyl-4,4'-diaminobiphenyl, 3,3'-dichloro-4,4'-diaminobiphenyl, 2,2',5,5'-tetrachloro-4,4'-diaminobiphenyl, 3,3'-dicarboxy-4,4'-diaminobiphenyl, 3,3'-dihydroxy-4,4'-diaminobiphenyl, 4,4'-diaminodiphenylsulfide, 3,3'-diaminodiphenyl ether, 4,4'-diaminodiphenyl ether, 3,4'-diaminodiphenyl ether, 4,4'-diaminodiphenylmethane, 4,4'-diaminobiphenyl, 4,4'-diaminooctafluorobiphenyl, 2,4-diaminotoluene, paraphenylenediamine, metaphenylenediamine, 2,2-bis[4-(4-aminophenoxy)phenyl]hexafluoropropane, 2,2-bis(4-aminophenyl)propane, 2,2-bis(4-aminophenyl)hexafluoropropane, 2,2-bis(3-hydroxy-4-aminophenyl)propane, 2,2-bis(3-hydroxy-4-aminophenyl)hexafluoropropane, 9,9-bis(4-aminophenyl)-10-hydroanthracene, orthotolidine sulfone, and some tetraamines such as 3,3'4,4'-biphenyltetraamine and 3,3',4,4'-tetraaminodiphenyl ether.

For the preparation of the polyamido acid of the present invention, it is favorable that a diamine ingredient containing an aromatic diamine of the general formula (5) is dissolved in an organic solvent. Thereafter, while agitating, an aromatic tetracarboxylic acid dianhydride of the general formula (4) is added to the resultant solution in the form of a solid or after dissolution in an organic solvent.

For the above reaction, it is preferred to use the aromatic tetracarboxylic acid dianhydride at a ratio by mole of 98 to 105 per 100 of the aromatic diamine. When the ratio is outside the above range, there may be the case where an intended degree of polymerization is not achieved so that satisfactory mechanical strength cannot be obtained. The reaction temperature is in the range of from 0° to 70° C., preferably from 0° to 30° C. over 70° C., the aromatic tetracarboxylic acid dianhydride may sometimes be more likely to decompose. The reaction time is in the range of from 2 to 50 hours, preferably from 3 to 20 hours. The resultant polyamido acid should preferably be dissolved in the organic solvent in an amount of from 5 to 30 wt %, preferably from 10 to 20 wt %. The amounts of the starting materials and the organic solvent should favorably be determined to attain the above-defined amount of the dissolved polyamido acid.

The organic solvent used for the reaction should preferably be polar in nature. Examples of such organic polar solvents include sulfoxide solvents such as dimethyl sulfoxide, diethyl sulfoxide and the like, formamide solvents such as N,N-dimethylformamide, N,N-diethylformamide and the like, acetamide solvents such as N,N-dimethylacetamide, N,N-diethylacetamide and the like, pyrrolidone solvents such as N-methyl-2-pyrrolidone, N-vinyl-2-pyrrolidone and the like, phenolic solvents such as phenol, o-, m- and p-cresol, xylenol, halogenated phenol, catechol and the like, hexamethylphosphoryl amide, γ-butyrolactone and the like. These may be used singly or in combination. Some aromatic hydrocarbons such as xylene, toluene and the like may also be used in the practice of the invention.

In this manner, the polyamido acid having the main recurring units of the formula (6) according to the invention can be prepared. The number of the recurring units of the formula (6) is not critical.

Where a polyimide, e.g. a polyimide film, is obtained from the thus obtained polyamido acid, the solution of the polyamido acid is cast or coated on a support, such as an endless belt, in the form of a film. The film is dried to obtain a self-supporting film. Subsequently, the film is peeled off from the support and fixed at end sides thereof, followed by gradual heating at about 200° to 500° C., preferably 300° to 450° C., at which thermal treatment is effected. After cooling, the film is removed from the fixed ends to obtain a polyimide film. By the thermal treatment, the —COHN— group joined to the benzene ring and the OH group at the ortho position are condensed through dehydration, thereby forming a benzoxazole ring and an imido ring to obtain a polyimide having main recurring units of the general formula (1) according to the following reaction formula

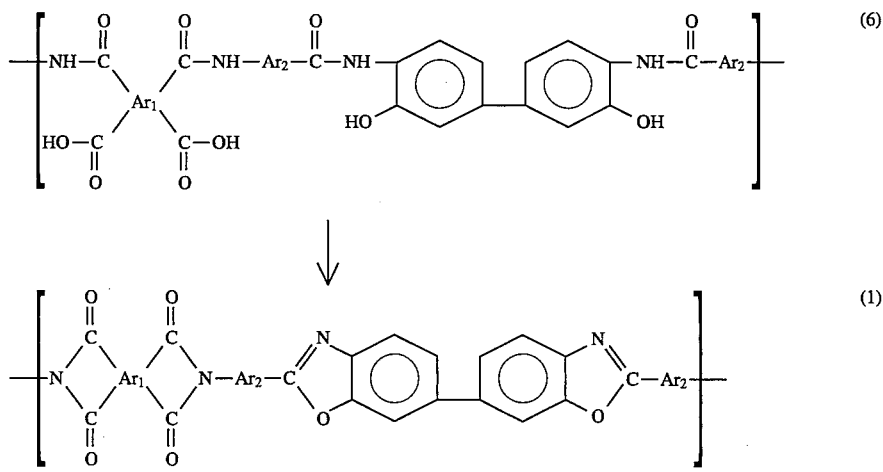

The dehydration and ring closure reaction may be carried out by use of a dehydration agent and/or a catalyst. Examples of the dehydration agents include aliphatic acid anhydrides, aromatic acid anhydrides, N,N-dialkylcarvone imide, lower fatty acid halides, allyl phosphonic acid halides, thionyl halides and mixtures of two or more of these compounds. The catalyst may be, for example, aliphatic tertiary amines such as triethylamine, aromatic tertiary amines such as dimethylaniline, heterocyclic tertiary amines, such as pyridine, β-picoline, iso-quinoline and the like, and mixtures of two or more of these compounds.

The polyimide copolymers of the present invention consists essentially of recurring units of the following general formula (2) and recurring units of the following general formula (3)

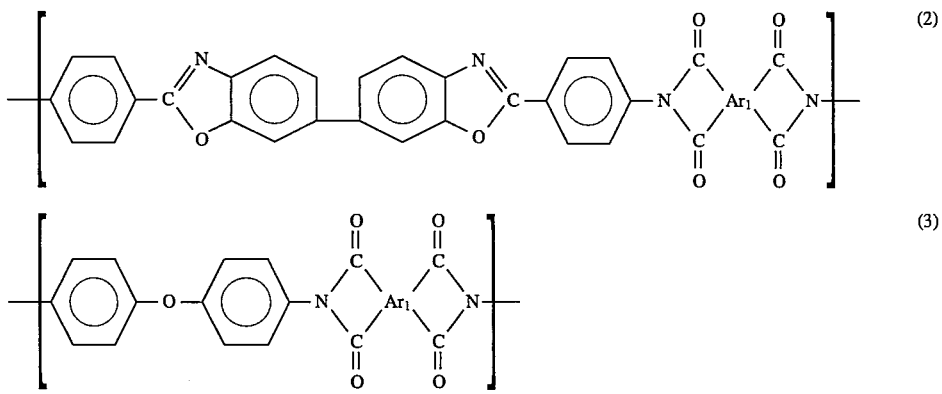

wherein $Ar_1$ has the same meaning as defined above.

The recurring units of the formula (2) and the recurring units of the formula (3) should preferably be present in the copolymer at a molar ratio of 10:90 to 90:10, more preferably 30:70 to 80:20. If the molar ratio of the recurring units of the formula (2) exceeds 90%, the resultant polyimide copolymer may be significantly lower in flexibility. On the other hand, when the molar ratio of the recurring units of the formula (3) exceeds 90%, the resultant polyimide copolymer may not be satisfactorily improved in the value of the coefficient of linear expansion and modulus of elasticity, and in water absorption.

The polyimide copolymer is a polymer which has a great molecular weight and should preferably have a logarithmic viscosity of 0.5 to 5 when measured, as a viscosity of the polyamido acid, at a concentration of 0.5/100 ml of DMF at a temperature of 30° C.

The polyimide copolymer can be prepared by polymerizing an aromatic diamine mainly composed of 4,4'-bis(4-aminobenzamido)-3,3'-dihydroxybiphenyl and 4,4'-diaminodiphenyl ether, and a tetracarboxylic acid dianhydride, thereby obtaining a polyamido acid copolymer, and subjecting the polyamido acid copolymer to dehydration and ring closure.

The mixing ratio by mole between the 4,4'-bis(4-aminobenzamido)3,3'-dihydroxybiphenyl and the 4,4'-diaminoddiphenyl ether used as the aromatic diamine should preferably be in the range of 10:90 to 90:10, preferably 30:70 to 80:20.

In the practice of the invention, the aromatic diamine should most preferably consist of 4,4'-bis(4-aminobenzamido)-3,3'-dihydroxybiphenyl and 4,4'-diaminoddiphenyl ether alone. If necessary, other aromatic polyvalent amines compounds may be used in combination with the above aromatic diamines.

The aromatic polyvalent amine compounds which are usable in combination may be those indicated hereinbefore. Those aromatic polyvalent amine compounds other than 4,4'-bis(4-aminobenzamido)-3,3'-dihydroxybiphenyl and 4,4'-diaminoddiphenyl ether may be used in amounts not impeding the purpose and effect of the present invention and should be present in amounts smaller than 10 mole %, preferably smaller than 5 mole %, based on the total of all the amine compounds used.

The polymerization reaction between the aromatic diamine and the tetracarboxylic acid dianhydride should preferably be effected by mixing in an organic polar solvent both compounds at a molar ratio of the aromatic diamine mixture and the tetracarboxylic acid dianhydride of 100:98 to 105. Outside this range, a degree of polymerization may not increase and thus satisfactory mechanical strength may not be expected.

The organic polar solvent used may be one which has been mentioned hereinbefore. The amount of the organic polar solvent is not critical. It is desirable that the amounts of the aromatic diamine, tetracarboxylic acid dianhydride and organic polar solvent are so determined that the polyamido acid copolymer obtained by the polymerization reaction is dissolved in the organic polar solvent in an amount of 5 to 30 wt %, preferably 10 to 20 wt %.

The polymerization reaction conditions include a temperature of 0° to 70° C., preferably 0° to 30° C. and a reaction time of 1 to 50 hours, preferably 3 to 20 hours. By the polymerization reaction, there can be efficiently obtained a polyamido acid copolymer.

The dehydration and ring closure of the polyamido acid copolymer can be carried out by ordinary procedures, and a thermal or chemical dehydration ring closure reaction can be favorably adopted. The thermal dehydration ring closure process is preferably one which comprises heating at 200° to 500° C. for 5 to 120 minutes.

The chemical dehydration ring closure reaction of the polyamido acid copolymer is preferably one which makes use of a dehydration agent and a catalyst. The dehydration agents may be ones which have been set out herein-before. The amount of the dehydration agent is generally in the range of about 0.5 to 10 moles, preferably 2 to 6 moles, per recurring unit of the polyamido acid. The catalyst may be one which has been set out hereinbefore and the amount thereof is in the range of about 0.01 to 4 moles, preferably 0.1 to 2 moles, per recurring unit of the polyamido acid.

The chemical dehydration ring closure reaction conditions include those of 70° to 400° C. and 2 to 20 hours, preferably those of 100° to 300° C. and 1 to 5 hours.

The polyimide copolymer may be formed as a film according to the procedure set out hereinbefore.

The polyimides of the invention have good characteristic properties such as a heat resistance and good mechanical strength, along with a low coefficient of linear expansion and good thermal dimensional stability. For instance, the polyimides are adapted for use as a film material for finely patternized flexible printed boards.

The present invention is more particularly described by way of Examples, which should not be construed as limiting the invention thereto. Comparative Examples are also shown.

SYNTHESIS EXAMPLE 4,4'-Bis(4-aminobenzamido)-3,3'-dihydroxybiphenyl was prepared according to the following procedure.

35.0 g (0.162 moles) of 3,3'-dihydroxy-4,4'-diaminobiphenyl and 36.0 g (0.356 moles) of triethylamine were dissolved in a mixed solvent of 300 ml of tetrahydrofuran and 300 ml of N,N-dimethylformamide (DMF) and cooled down to 0° C. Thereafter, a solution of 63.1 g (0.340 moles) of p-nitrobenzoyl chloride in 150 ml of tetrahydrofuran was dropped in the solution in such a way that the resultant reaction solution had a temperature not higher than 10° C. Subsequently, the reaction solution was poured into one liter of methanol thereby permitting the resulting reaction product to be precipitated, followed by filtering, washing with tetrahydrofuran, then with water and finally with methanol, and drying to obtain crude red crystals of 4,4'-bis(4-aminobenzamido)-3,3'-dihydroxybiphenyl. The yield was 82.1 g (at a yield of 99.7%). The crude crystals were recrystallized from a mixed solvent of dimethylformamide and methanol to obtain a pure product.

EXAMPLES 1–3

DMF was charged into a 500 ml flask in such an amount that 10 wt % of a polyamido acid was finally obtained. While passing a nitrogen gas, 16.816 g (0.0370 moles) of 4,4'-bis(4-aminobenzamido)-3,3'-dihydroxybiphenyl was added to the flask and dissolved in DMF. Thereafter, each of the compounds indicated in Table 1 was further added as an acid dianhydride in an amount of 0.0370 moles, followed by reaction at 25° C. for 3 hours, thereby obtaining a polyamido acid.

The thus obtained polyamido acids were each coated on a glass plate by means of an applicator and dried in an oven at 110° C. for 60 minutes, followed by peeling off and setting on an iron frame. Then, the solvent was removed under conditions of 200° C. for 60 minutes, then 200° to 400° C. for 60 minutes while rising the temperature, and finally 400° C. for 15 minutes, whereupon dehydration and ring closure took place, thereby obtaining an about 25 μm thick polyimide film.

COMPARATIVE EXAMPLE 1

The general procedure of Example 1 was repeated except that 7.409 g (0.037 moles) of 4,4'-diaminodiphenyl ether was used as the aromatic diamine compound and DMF was used in an amount of 139.3 g, thereby obtaining a polyimide film.

COMPARATIVE EXAMPLE 2

The general procedure of Example 3 was repeated except that 7.409 g (0.037 moles) of 4,4'-diaminodiphenyl ether was used as the aromatic diamine compound and DMF was used in an amount of 164.7 g, thereby obtaining a polyimide film.

The thus obtained films were subjected to measurements of mechanical characteristics, a coefficient of linear expansion and a water absorption according to the following procedures. The results of the measurements are shown in Table 1.

(1) Mechanical Characteristics (tensile strength, tensile elongation and tensile modulus of elasticity)

Determined according to the methods described in ASTM D882–88.

(2) Coefficient of linear expansion

An average value of measurements of a coefficient of linear expansion was determined using TMA-7000 made by Shinku Riko K. K., under conditions of a heating rate of 5° C./minute and a temperature of 150° to 200° C.

(3) Water absorption

A polyimide film was allowed to stand at 90% R. H. over 24 hours and the weights of the film prior to and after the standing were measured to determine a water absorption.

(4) Logarithmic viscosity

The viscosity of a polyamido acid solution having a concentration of 0.5 g of polyamido acid per 100 ml of DMF was measured, from which the logarithmic viscosity was calculated according to the following equation.

$$\text{Logarithmic viscosity} = \frac{\text{natural logarithm (viscosity of solution/ viscosity of solvent)}}{\text{polymer concentration in solution}}$$

The infrared absorption spectra of the polyimide film obtained in Example 1 are shown in FIG. 1. From the figure, it will be seen that absorptions based on the imido ring are found at 1780, 1720 and 1360 $cm^{-1}$ and that absorptions based on the benzoxazole ring are found at 1620, 1260 and 1060 $cm^{-1}$. This reveals that the imido ring and the benzoxazole are formed.

LOGARITHMIC VISCOSITY

The viscosity of a polyamido acid solution having a concentration of 0.5 g of polyamido acid per 100 ml of DMF was measured, from which the logarithmic viscosity was calculated according to the following equation.

$$\text{Logarithmic viscosity} = \frac{\text{natural logarithm (viscosity of solution/ viscosity of solvent)}}{\text{polymer concentration in solution}}$$

viscosity was determined according to the following procedures.

TABLE 1

|  | Example | | | Comparative Example | |
|---|---|---|---|---|---|
|  | 1 | 2 | 3 | 1 | 2 |
| Acid dianhydride |  |  |  |  |  |
| Pyromellitic acid dianhydride (g) | 8.070 | — | — | 8.070 | — |
| 3,3',4,4'-biphenyltetracarboxylic acid dianhydride (g) | — | 10.886 | — | — | — |
| 3,3',4,4'-benzophenonetetra-carboxylic acid dianhydride (g) | — | — | 11.923 | — | 11.923 |
| Diamine: |  |  |  |  |  |
| 4,4,'-bis(4-aminobenzamido)-3,3'-dihydroxybiphenyl (g) | 16.816 | 16.816 | 16.816 | — | — |
| 4,4'-diaminodiphenyl ether (g) | — | — | — | 7.409 | 7.409 |
| Test results |  |  |  |  |  |
| Tensile strength (kg/$mm^2$) | 27.4 | 31.8 | 31.6 | 17.8 | 17.1 |
| Tensile elongation (%) | 9 | 11 | 12 | 57 | 36 |
| Tensile modulus of elasticity (kgf/$mm^2$) | 788 | 882 | 862 | 279 | 352 |
| Coefficient of linear expansion ($\times 10^{-5}$/cm/°C.) | −0.09 | 0.03 | 0.10 | 2.27 | 3.73 |
| Water absorption (%) | 1.10 | 1.48 | 1.50 | 2.21 | 2.10 |
| Logarithmic viscosity (dl/g) | 2.1 | 1.0 | 1.4 | 1.4 | 2.0 |

The results of Table 1 reveal that the polyimides of the invention obtained from polyamido acids have good mechanical characteristics, a low coefficient of linear expansion, and a low water absorption.

EXAMPLES 4–6

In the same manner as in the foregoing examples, there were obtained films using, as an aromatic diamine mixture, 4,4'-bis(4-aminobenzamido)-3,3'-dihydroxybiphenyl and 4,4'-diaminodiphenyl ether and pyromellitic acid dianhydride in amounts indicated in Table 2. The film characteristics are also shown in Table 2.

EXAMPLE 7

In the same manner as in the foregoing examples, there was obtained a film using, as an aromatic diamine mixture, 4,4'-bis(4-aminobenzamido)-3,3'-dihydroxybiphenyl and 4,4'-diaminodiphenyl ether at a molar ratio of 1:1. The film characteristics are shown in Table 2.

The mechanical characteristics, the coefficient of linear expansion and the water absorption were determined in the same manner as in the foregoing examples and a logarithmic

TABLE 2

|  | Example | | | |
|---|---|---|---|---|
|  | 4 | 5 | 6 | 7 |
| Pyromellitic acid dianhydride (g) | 8.070 | 8.070 | 8.070 | — |
| 3,3'4,4'-biphenyltetracarboxylic acid dianhydride (g) | 0 | 0 | 0 | 10.886 |
| (I) 4,4'-diaminodiphenyl ether (g) | 5.557 | 3.704 | 1.852 | 3.704 |
| (II) 4,4'-bis(4-aminobenzamido)-3,3'- dihydroxybiphenyl (g) | 4.204 | 8.408 | 12.612 | 8.408 |
| (I)/(II) (molar ratio) | 75/25 | 50/50 | 25/75 | 50/50 |
| Tensile strength (kg/$mm^2$) | 19.3 | 22.7 | 28.1 | 24.3 |
| Tensile elongation (%) | 39 | 23 | 20 | 27 |
| Tensile modulus of elasticity (kgf/$mm^2$) | 449 | 517 | 599 | 498 |
| Coefficient of linear expansion ($\times 10^{-5}$/cm/°C.) | 1.51 | 0.63 | 0.35 | 0.85 |
| Water absorption (%) | 1.71 | 1.26 | 1.18 | 1.80 |
| Logarithmic viscosity (dl/g) | 1.5 | 2.6 | 2.0 | 1.2 |

The results of Table 2 reveal that the polyimide copolymers of the invention have good mechanical strength, low coefficient of linear expansion and water absorption, and high modulus of elasticity and flexibility.

What is claimed is:

1. A process for preparing a polyimide having main recurring units of the following formula (1)

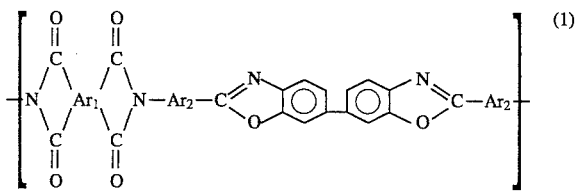

wherein $Ar_1$ represents a tetravalent aromatic group and each $Ar_2$ represents a divalent aromatic group, which comprises polymerizing at least one aromatic tetracarboxylic acid dianhydride of the following formula (4)

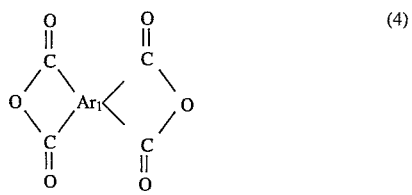

wherein $Ar_1$ is defined above, and at least one aromatic diamine of the following formula (5)

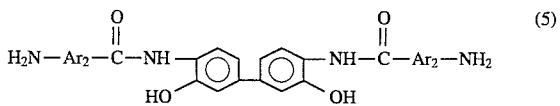

wherein $Ar_2$ is defined above, to obtain a polyamido acid having recurring units of the following formula (6)

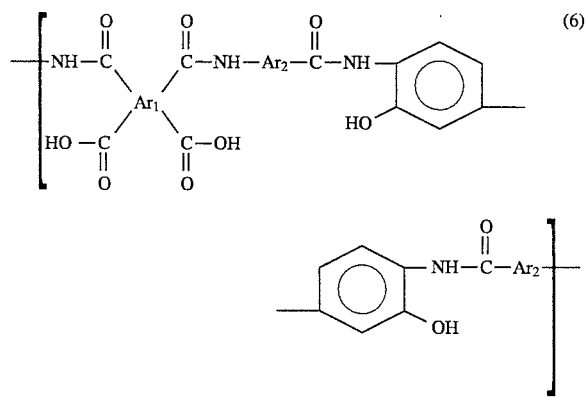

wherein $Ar_1$ and $Ar_2$ have the same meanings as defined above, and condensing a —COHN— group joined to a benzene ring and an OH group at the ortho position through dehydration to thereby form a benzoxazole ring, and forming an imido ring to obtain the polyimide having main recurring units of formula (1).

2. A process for preparing a polyimide copolymer, which comprises polymerizing an aromatic diamine mixture comprising 4,4'-bis(4-aminobenzamido)-3,3'-dihydroxybiphenyl and 4,4'-diamidodiphenyl ether, and a tetracarboxylic acid dianhydride to obtain a polyamido acid copolymer, and condensing a —COHN— group joined to a benzene ring and an OH group at the ortho position through dehydration to thereby form a benzoxazole ring, and forming an imido ring to obtain the polyimide copolymer.

3. The process for preparing a polyimide according to claim 1, wherein at least one aromatic tetracarboxylic acid dianhydride of formula (4) selected from the group consisting of pyromellitic acid dianhydride, 3,3',4,4'-biphenyltetracarboxylic acid dianhydride, 2,3,3',4'-biphenyltetracarboxylic acid dianhydride, 2,3,6,7-naphthalenetetracarboxylic acid dianhydride, 3,3'4,4'-benzophenonetetracarboxylic acid dianhydride, 1,4,5,8-naphthalenetetracarboxylic acid dianhydride, 2,2-bis(3,4-dicarboxyphenyl)propane dianhydride, bis(3,4-dicarboxyphenyl)ethane dianhydride, bis(3,4-dicarboxyphenyl)ether dianhydride, 1,1-bis(3,4-dicarboxyphenyl)ethane dianhydride, 3,4,9,10-perylenetetracarboxylic acid dianhydride, benzene-1,2,3,4-tetracarboxylic acid dianhydride, 2,3,6,7-anthracenetetracarboxylic acid dianhydride, and 1,2,7,8-phenylenetetracarboxylic acid dianhydride is reacted with at least one aromatic diamine of formula (5).

4. The process for preparing a polyimide according to claim 1, wherein $Ar_2$ in formulae (1), (5) and (6) is

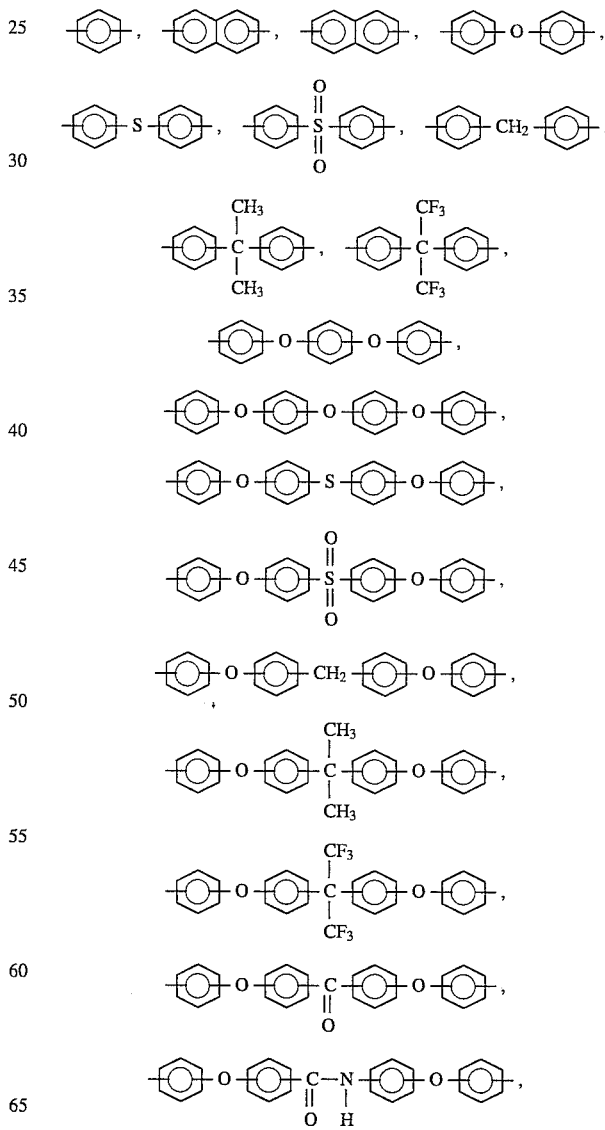

-continued

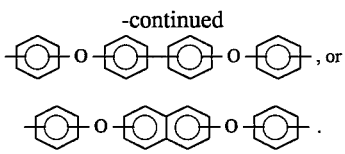

5. The process for preparing a polyimide according to claim 1, wherein at least one aromatic tetracarboxylic acid dianhydride of formula (4) is reacted with at least one aromatic diamine selected from the group consisting of

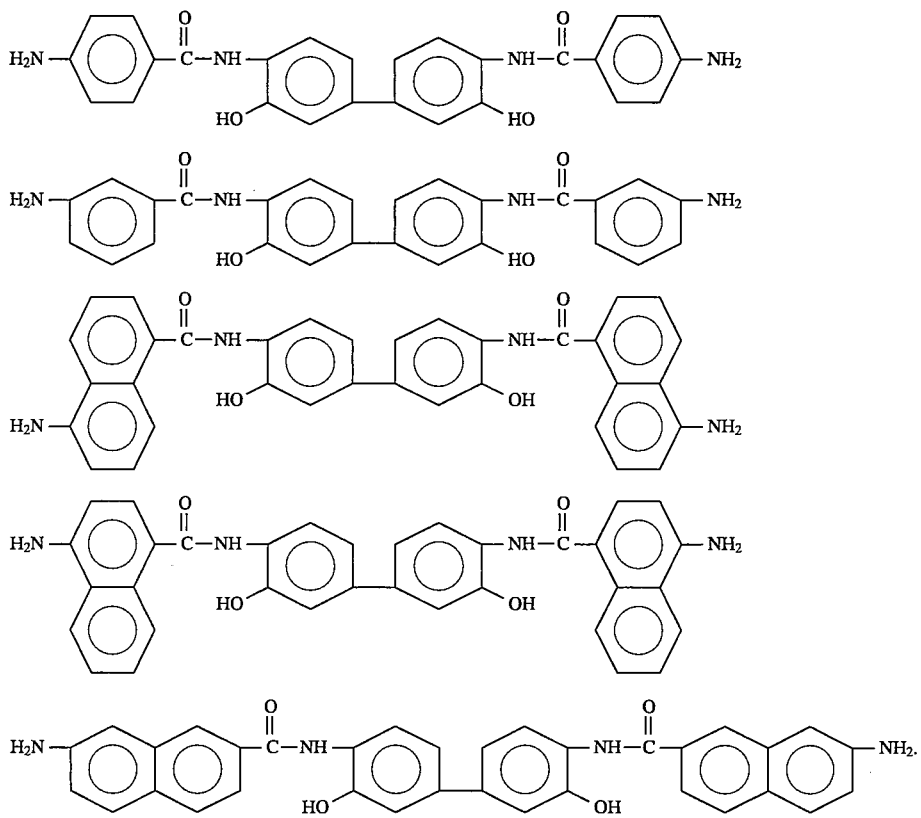

6. The process for preparing a polyimide according to claim 1, wherein at least one aromatic tetracarboxylic acid dianhydride of formula (4) is reacted with at least one aromatic diamine of formula (5) in one or more polar organic solvent selected from the group consisting of a sulfoxide solvent, a formamide solvent, an acetamide solvent, pyrrolidone solvent, phenolic solvent, hexamethylphosphoryl amide, γ-butyrolactone, and aromatic hydrocarbon solvent, and the polyamido acid is dissolved in the organic solvent in an amount of from 5 to 30 wt. %.

7. The process for preparing a polyimide according to claim 1, wherein 98 to 105 moles of at least one aromatic tetracarboxylic acid dianhydride of formula (4) is reacted with 100 moles of at least one aromatic diamine of formula (5).

8. The process for preparing a polyimide according to claim 1, wherein at least one aromatic tetracarboxylic acid dianhydride of formula (4) is reacted with at least one aromatic diamine of formula (5) at a temperature of 0° to 70° C.

9. The process for preparing a polyimide according to claim 1, wherein at least one aromatic tetracarboxylic acid dianhydride of formula (4) is reacted with at least one aromatic diamine of formula (5) at a temperature of 0° to 30° C.

10. The process for preparing a polyimide according to claim 1, wherein at least one aromatic tetracarboxylic acid dianhydride of formula (4) is reacted with at least one aromatic diamine of formula (5) for 2 to 50 hours.

11. The process for preparing a polyimide according to claim 1, wherein the —COHN— group and OH group are condensed and the imido ring is formed in the presence of at least one dehydration agent, at least one catalyst, or a mixture of at least one dehydration agent and at least one catalyst, and the dehydration agent is selected from the group consisting of aliphatic acid anhydride, aromatic acid anhydride, N,N-dialkylcarvone imide, lower fatty acid halide, allyl phosphonic acid halide, and thionyl halide, and the catalyst is selected from the group consisting of aliphatic tertiary amine, aromatic tertiary amine and heterocyclic tertiary amine.

12. The process for preparing a polyimide copolymer according to claim 2, wherein 98 to 105 moles of the tetracarboxylic acid dianhydride is polymerized with 100 moles of the aromatic diamine mixture.

13. The process for preparing a polyimide copolymer according to claim 2, wherein the aromatic diamine mixture is polymerized with the tetracarboxylic acid dianhydride at a temperature of 0° to 70° C.

14. The process for preparing a polyimide copolymer according to claim 2, wherein the aromatic diamine mixture is polymerized with the tetracarboxylic acid dianhydride at a temperature of 0° to 30° C.

15. The process for preparing a polyimide copolymer according to claim 2, wherein the aromatic diamine mixture is polymerized with the tetracarboxylic acid dianhydride for 1 to 50 hours.

16. The process for preparing a polyimide copolymer according to claim 1, wherein the polyamido acid copolymer is heated at 200° to 500° C. for 5 to 120 minutes, or at a temperature of 70° to 400° C. and 2 to 20 hours in the presence of a dehydration agent and a catalyst, to obtain the polyimide copolymer.

17. The process for preparing a polyimide according to claim 1, wherein the aromatic tetracarboxylic acid dianhydride is pyromellitic acid dianhydride and the aromatic diamine is 4,4'-bis(4-aminobenzamido)-3,3'-dihydroxybiphenyl.

18. The process for preparing a polyimide according to claim 1, wherein the aromatic tetracarboxylic acid dianhydride is 3,3'4,4'-biphenyltetracarboxylic acid dianhydride and the aromatic diamine is 4,4'-bis(4-aminobenzamido)-3,3'-dihydroxybiphenyl.

19. The process for preparing a polyimide according to claim 1, wherein the aromatic tetracarboxylic acid dianhydride is 3,3',4,4'-benzophenonetetracarboxylic acid dianhydride and the aromatic diamine is 4,4'-bis(4-aminobenzamido)-3,3'-dihydroxybiphenyl.

20. The process for preparing a polyimide copolymer according to claim 2, wherein the tetracarboxylic acid dianhydride is pyromellitic acid dianhydride or 3,3',4,4'-biphenyltetracarboxylic acid dianhydride.

* * * * *